United States Patent
Lyakh

(10) Patent No.: US 11,509,114 B2
(45) Date of Patent: Nov. 22, 2022

(54) QUANTUM CASCADE LASER SYSTEM WITH ANGLED ACTIVE REGION

(71) Applicant: UNIVERSITY OF CENTRAL FLORIDA RESEARCH FOUNDATION, INC., Orlando, FL (US)

(72) Inventor: Arkadiy Lyakh, Oviedo, FL (US)

(73) Assignee: UNIVERSITY OF CENTRAL FLORIDA RESEARCH FOUNDATION, INC., Orlando, FL (US)

(*) Notice: Subject to any disclaimer, the term of this patent is extended or adjusted under 35 U.S.C. 154(b) by 173 days.

(21) Appl. No.: 17/004,205

(22) Filed: Aug. 27, 2020

(65) Prior Publication Data

US 2020/0395736 A1    Dec. 17, 2020

Related U.S. Application Data

(62) Division of application No. 16/401,515, filed on May 2, 2019, now Pat. No. 10,790,637, which is a division
(Continued)

(51) Int. Cl.
*H01S 5/34* (2006.01)
*H01S 5/10* (2021.01)
(Continued)

(52) U.S. Cl.
CPC .......... *H01S 5/1085* (2013.01); *H01S 5/0614* (2013.01); *H01S 5/1003* (2013.01);
(Continued)

(58) Field of Classification Search
CPC .... H01S 5/3401; H01S 5/3402; H01S 5/4037; H01S 5/1085; H01S 5/12–1246
See application file for complete search history.

(56) References Cited

U.S. PATENT DOCUMENTS

| 4,783,788 A | 11/1988 | Gordon |
| 4,791,648 A | 12/1988 | Vojak et al. |

(Continued)

FOREIGN PATENT DOCUMENTS

EP    0115390 A2    8/1994

OTHER PUBLICATIONS

Walpole, Semiconductor amplifiers and lasers with tapered gain regions, SpringerLink, Optical and Quantum Electronics, Jun. 1996, vol. 28, Issue 6, pp. 623-645, Lincoln Laboratory, Massachusetts Institute of Technology, Lexington, USA. **See Priority U.S. Appl. No. 15/677,572, filed Aug. 15, 2017.
(Continued)

*Primary Examiner* — Tod T Van Roy
*Assistant Examiner* — Delma R Fordé
(74) *Attorney, Agent, or Firm* — Allen, Dyer, Doppelt + Gilchrist, PA

(57) ABSTRACT

A QCL may include a substrate, an emitting facet, and semiconductor layers adjacent the substrate and defining an active region. The active region may have a longitudinal axis canted at an oblique angle to the emitting facet of the substrate. The QCL may include an optical grating being adjacent the active region and configured to emit one of a CW laser output or a pulsed laser output through the emitting facet of substrate.

20 Claims, 4 Drawing Sheets

Related U.S. Application Data of application No. 15/677,572, filed on Aug. 15, 2017, now Pat. No. 10,355,449.

(60) Provisional application No. 62/375,044, filed on Aug. 15, 2016.

(51) Int. Cl.

| | | |
|---|---|---|
| *H01S 5/06* | (2006.01) | |
| *H01S 5/125* | (2006.01) | |
| *H01S 5/40* | (2006.01) | |
| *H01S 5/12* | (2021.01) | |
| *H01S 5/20* | (2006.01) | |
| *H01S 5/227* | (2006.01) | |
| *H01S 5/065* | (2006.01) | |
| *H01S 5/22* | (2006.01) | |

(52) U.S. Cl.
CPC ............ *H01S 5/125* (2013.01); *H01S 5/1237* (2013.01); *H01S 5/2036* (2013.01); *H01S 5/2275* (2013.01); *H01S 5/3401* (2013.01); *H01S 5/3402* (2013.01); *H01S 5/4037* (2013.01); *H01S 5/0654* (2013.01); *H01S 5/101* (2013.01); *H01S 5/1231* (2013.01); *H01S 5/22* (2013.01)

(56) References Cited

U.S. PATENT DOCUMENTS

| | | |
|---|---|---|
| 4,845,725 A | 7/1989 | Welch et al. |
| 4,856,017 A | 8/1989 | Ungar |
| 4,942,585 A | 7/1990 | Ungar |
| 5,131,002 A | 7/1992 | Mooradian |
| 5,272,711 A | 12/1993 | Mawst et al. |
| 5,323,414 A | 6/1994 | Baird et al. |
| 5,337,328 A | 8/1994 | Lang et al. |
| 5,590,141 A | 12/1996 | Baird et al. |
| 5,675,601 A | 10/1997 | Karakida et al. |
| 5,901,168 A | 5/1999 | Baillargeon et al. |
| 5,995,692 A | 11/1999 | Hamakawa et al. |
| 6,014,396 A | 1/2000 | Osinski et al. |
| 6,075,801 A | 6/2000 | Tamanuki et al. |
| 6,167,073 A | 12/2000 | Botez et al. |
| 6,239,901 B1 | 5/2001 | Kaneko |
| 6,256,330 B1 | 7/2001 | LaComb |
| 6,326,646 B1 | 12/2001 | Baillargeon et al. |
| 6,339,606 B1 | 1/2002 | Alphonse |
| 6,421,363 B1 | 7/2002 | Osinski et al. |
| 6,459,715 B1 | 10/2002 | Khalfin et al. |
| 6,477,191 B1 | 11/2002 | Okada et al. |
| 6,580,740 B2 | 6/2003 | Funabashi et al. |
| 6,594,297 B1 | 7/2003 | Hayakawa |
| 6,625,182 B1 | 9/2003 | Kuksenkov et al. |
| 6,873,638 B2 | 3/2005 | Haase et al. |
| 6,996,152 B2 | 2/2006 | Vurgaftman et al. |
| 7,248,618 B2 | 7/2007 | Volodin et al. |
| 8,014,430 B2 | 9/2011 | Patel et al. |
| 8,068,524 B1 | 11/2011 | Patel et al. |
| 8,121,164 B1 | 2/2012 | Lyakh et al. |
| 9,077,153 B2 | 7/2015 | Maulini et al. |
| 9,608,408 B2 | 3/2017 | Lyakh et al. |
| 10,008,829 B2 | 6/2018 | Dougakiuchi et al. |
| 10,177,535 B1 | 1/2019 | Lyakh |
| 2002/0135663 A1 | 9/2002 | Miyagawa et al. |
| 2004/0202218 A1 | 10/2004 | Thornton |
| 2004/0218652 A1 | 11/2004 | Spariosu et al. |
| 2005/0083568 A1 | 4/2005 | Nakae et al. |
| 2007/0223552 A1 | 9/2007 | Muendel et al. |
| 2009/0041061 A1 | 2/2009 | Shkunov et al. |
| 2009/0213890 A1 | 8/2009 | Patel et al. |
| 2011/0305256 A1 | 12/2011 | Chann et al. |
| 2013/0010823 A1 | 1/2013 | Maulini et al. |
| 2015/0070698 A1* | 3/2015 | Muraviev ................ G01J 3/26 356/451 |
| 2015/0103857 A1 | 4/2015 | Maulini et al. |
| 2016/0211647 A1 | 7/2016 | Olmsted |
| 2016/0322788 A1 | 11/2016 | Lyakh et al. |
| 2017/0194765 A1* | 7/2017 | Razeghi ................ H01S 5/4037 |

OTHER PUBLICATIONS

Goldberg et al., High-power, near-diffraction-limited large-area traveling-wave semiconductor amplifiers, IEEE Journal of Quantum Electronics, vol. 29 Issue: 6, pp. 2028-2043, Jun. 1993. **See Priority U.S. Appl. No. 15/677,572, filed Aug. 15, 2017.

Welford et al., Observation of linewidth broadening in (GaAl)As diode lasers due to electron number fluctuations, Applied Physics Letters, vol. 40, Issue 7, 1982, Published online Jun. 1998. **See Priority U.S. Appl. No. 15/677,572, filed Aug. 15, 2017.

Lee at al., High-average-power Nd:YAG planar waveguide laser that is face pumped by 10 laser diode bars, Optical Society of America (OSA) Publishing, Optics Letters, vol. 27, Issue 7, p. 524-526, 2002. **See Priority U.S. Appl. No. 15/677,572, filed Aug. 15, 2017.

Chilla et al., Recent advances in optically pumped semiconductor lasers, Article in Proceedings of SPIE—The International Society for Optical Engineering, Feb. 2007. **See Priority U.S. Appl. No. 15/677,572, filed Aug. 15, 2017.

Andrew M. Sarangan et al. "Spectral properties of angled-grating high-power semiconductor lasers" IEEE Journal of Quantum Electronics, vol. 35, No. 8, Aug. 1999, pp. 1220-1230. **See Priority U.S. Appl. No. 15/677,572, filed Aug. 15, 2017.

Robert J. Lang et al. "Theory of grating-confined broad-area lasers", IEEE Journal of Quantum Electronics, vol. 34, No. 11, Nov. 1998, pp. 2196-2210. **See Priority U.S. Appl. No. 15/677,572, filed Aug. 15, 2017.

Dan Botez et al. "Tapered active-region, mid-infrared quantum cascade lasers for complete suppression of carrier-leakage currents" Proc. Of SPIE vol. 8277, Feb. 2012, pp. 82770W-1 trough 82770W-9. **See Priority U.S. Appl. No. 15/677,572, filed Aug. 15, 2017.

Gmachl et al. "Continuous-wave and high-power pulsed operation index-coupled distributed feedback quantum cascade laser at $\lambda \approx 8.5$ μm" Applied Physics Letters 1998 72:12, 1430-1432. Abstract Only. **See Priority U.S. Appl. No. 15/677,572, filed Aug. 15, 2017.

Ribbat et al. "Complete suppression of filamentation and superior beam quality in quantum-dot lasers" Applied Physics Letters 82, 952 (2003) Abstract Only. **See Priority U.S. Appl. No. 15/677,572, filed Aug. 15, 2017.

Kim et al. "Room-temperature 2.5 μm InGaAsSb/AlGaAsSb diode lasers emitting 1 W continuous waves" Applied Physics Letters: vol. 81 No. 17; Oct. 21, 2002. pp. 3146-3148. **See Priority U.S. Appl. No. 15/677,572, filed Aug. 15, 2017.

Gmachi et al. "Dependence of the device performance on the number of stages in quantum-cascade lasers" IEEE Journal of Selected Topics in Quantum Electronics: vol. 5, Issue 3, May/Jun. 1999. Abstract Only. **See Priority U.S. Appl. No. 15/677,572, filed Aug. 15, 2017.

Walpole, J.M. "Semiconductor amplifiers and lasers with tapered gain regions" Optical and Quantum Electronics Jun. 1996, vol. 28, Issue 6, pp. 623-645. Abstract Only. **See Priority U.S. Appl. No. 15/677,572, filed Aug. 15, 2017.

C. Gmachl et al., "Improved CW operation of quantum cascade lasers with epitaxial-side heat-sinking," in IEEE Photonics Technology Letters, vol. 11, No. 11, pp. 1369-1371, Nov. 1999. Abstract Only. **See Priority U.S. Appl. No. 15/677,572, filed Aug. 15, 2017.

Al-Muhanna et al. "High-power (> 10 W) continuous-wave operation from 100-μm-aperture 0.97-μm-emitting Al-free diode lasers" Applied Physics Letters: vol. 73, No. 9; Aug. 31, 1998. pp. 1182-1184. **See Priority U.S. Appl. No. 15/677,572, filed Aug. 15, 2017.

Knauer et al. "High-power 808 nm lasers with a super-large optical cavity" Semiconductor Science and Technology, vol. 20, No. 6; Apr. 27, 2005. Abstract Only **See Priority U.S. Appl. No. 15/677,572, filed Aug. 15, 2017.

(56) References Cited

OTHER PUBLICATIONS

Dan Botez "cw high-power single-mode operation of constricted double-heterojunction AlGaAs lasers with a large optical cavity" Applied Physics Letters: vol. 36, No. 3; Feb. 1, 1980. pp. 190-192. **See Priority U.S. Appl. No. 15/677,572, filed Aug. 15, 2017.

Kintzer et al. "High-power, strained-layer amplifiers and lasers with tapered gain region" IEEE Photonics Technology Letters: vol. 5, No. 6, Jun. 1993. Abstract Only. **See Priority U.S. Appl. No. 15/677,572, filed Aug. 15, 2017.

Slipchenko et al. "Ultralow internal optical loss in separate-confinement quantum-well laser heterostructures" Semiconductors: vol. 38, No. 12, Dec. 2004. Abstract Only. **See Priority U.S. Appl. No. 15/677,572, filed Aug. 15, 2017.

* cited by examiner

QUANTUM CASCADE LASER SYSTEM WITH ANGLED ACTIVE REGION

RELATED APPLICATIONS

This application is a divisional of U.S. application Ser. No. 16/401,515 filed on May 2, 2019, which is a divisional of U.S. application Ser. No. 15/677,572 filed on Aug. 15, 2017, now patent U.S. Pat. No. 10,355,449, which is based upon prior filed Provisional Application No. 62/375,044 filed Aug. 15, 2016, the entire subject matter of these applications is incorporated herein by reference in its entirety.

TECHNICAL FIELD

The present disclosure relates to lasers and, in particular, to quantum cascade laser and related methods.

BACKGROUND

Quantum cascade lasers (QCLs) differ from traditional semiconductor diode lasers in that they do not use a p-n junction for light emission. Multiple active regions are "cascaded" so that each injected electron can emit multiple photons and therefore enhance laser gain. Each active region includes a multi-layered semiconductor material structure. This multi-layered semiconductor material structure is designed to have an electronic band structure that gives the desired emission wavelength, and is manufactured with nanometer-level thickness control.

Most commercially available QCLs are of the "edge-emitting" variety. In these, linear ridges are created by etching vertically through the layered structure, which has been grown on a wafer substrate. These are cleaved so that the active region comprises a rectangular ridge several millimeters in length, which forms a waveguide. The laser radiation is amplified by passing back and forth along the axis of the ridge. Laser emission occurs on the end facets of these ridges.

SUMMARY

Generally speaking, a QCL may include a substrate and semiconductor layers adjacent the substrate and defining an active region. The active region may have a longitudinal axis canted at an oblique angle to the at least one emitting facet of the laser chip. The QCL may include an optical grating being adjacent the active region and configured to emit one of a continuous wave (CW) laser output or a pulsed laser output through the at least one emitting facet.

In some embodiments, the optical grating may define a plurality of ridges substantially parallel with the longitudinal axis of the active region. For example, the optical grating may comprise a Bragg grating. The active region may be configured to operate in a single lateral mode.

Additionally, the optical grating may comprise a shallow ridge configuration grating with etching stopped before reaching the active region and the QCL may include an electrical contact strip coupled to the semiconductor layers. The electrical contact strip may have a width configured to control an effective active region width.

Also, the active region may have a thickness less than or equal to 1.3 µm, and the active region may have a width greater than or equal to 20 µm. The active region may have an elongate shape extending laterally across the substrate.

Another aspect is directed to a QCL system. The QCL system may include at least one QCL comprising a substrate, at least one emitting facet, and semiconductor layers adjacent the substrate and defining an active region. The active region may have a longitudinal axis canted at an oblique angle to the at least one emitting face of the substrate. The at least one QCL may comprise an optical grating being adjacent the active region and configured to emit one of a CW laser output or a pulsed laser output through the at least one emitting facet. The QCL system may include a driver circuit coupled to the at least one QCL. In some embodiments, the at least one QCL may include an array thereof arranged in W-shape.

Another aspect is directed to a method for making a QCL. The method may include forming a substrate and at least one emitting facet, and forming a semiconductor layers adjacent the substrate and defining an active region. The active region may have a longitudinal axis canted at an oblique angle to the at least one emitting facet of the substrate. The method may comprise forming an optical grating being adjacent the active region and configured to emit one of a CW laser output or a pulsed laser output through the at least one emitting facet.

DETAILED DESCRIPTION

Figure 1:
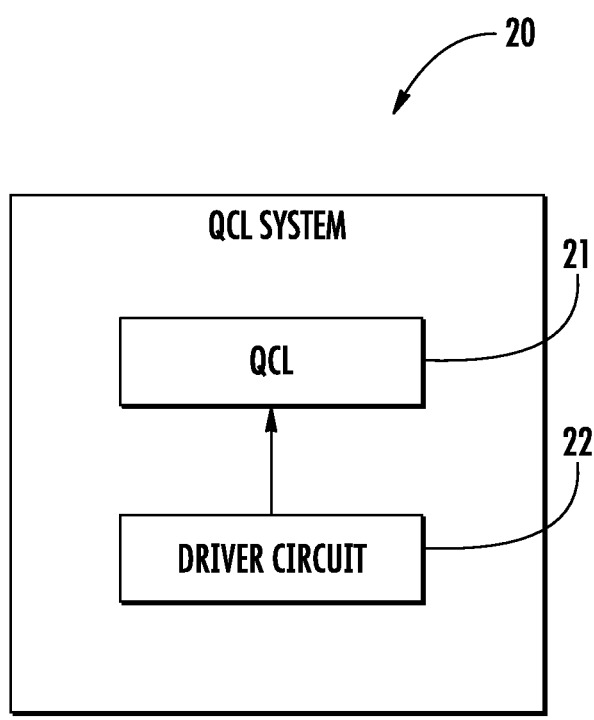
FIG. 1 is a schematic diagram of a QCL system, according to the present disclosure.

The present disclosure will now be described more fully hereinafter with reference to the accompanying drawings, in which several embodiments of the present disclosure are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

Referring initially to FIG. 1, a QCL system 20 according to the present disclosure is now described. The QCL system 20 illustratively includes a QCL 21, and a driver circuit 22 coupled to the QCL and configured to power the QCL. The QCL 21 illustratively includes a substrate (e.g. InP, GaAs, GaSb, Si).

Referring now to FIGS. 2-7, a very high peak optical power level for QCLs, can be achieved by increasing active region dimensions [1]. Specifically, peak optical power scales with active region width, a region where electron transitions between quantized energy levels produce infrared photons. The increase in power for broad area devices with increase in active region width, however, comes at the expense of a reduced beam quality as wider waveguides support higher order lateral modes, and high order modes have a larger lateral divergence compared to that for the fundamental lateral mode. As a consequence, broad area devices are typically used only in a limited set of practical applications, such as laser-based beacons and illuminators, where a high beam quality is not required.

Figure 2:
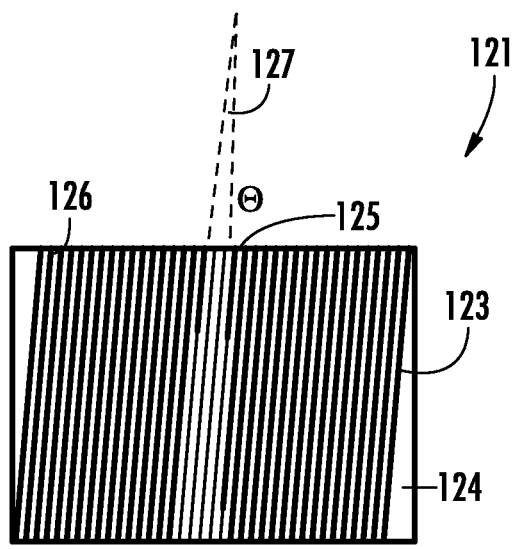
FIG. 2 is a schematic diagram of an α-distributed feedback waveguide, according to the present disclosure.
Figure 3:
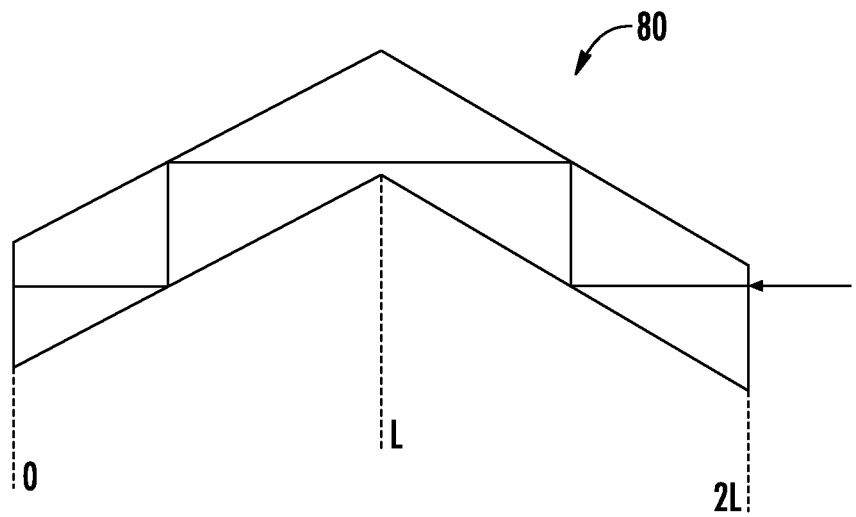
FIG. 3 is a schematic diagram of an unfolded α-distributed feedback waveguide, according to the present disclosure.

It was demonstrated for the traditional diode lasers that lateral beam quality for broad area devices can be controlled by employing the so-called α-DFB configuration (diagram 80 FIG. 3). In the α-DFB configuration, the active region, shown in yellow in FIG. 2, is defined at an angle deviating from 90° relative to the output facet [2, 3]. In addition, a Bragg grating with groves parallel to the active region stripe is etched into the upper waveguide and cladding layers. The combination of the lateral grating and the angle between the stripe and the chip facets forces the semiconductor laser operate on a single spatial mode.

The operational principles of the α-DFB configuration can be illustrated using the ray-optics approximation. Ray propagation within the waveguide shown in FIG. 2 is equivalent to that in an unfolded waveguide shown in FIG. 3. The waves propagating along the active region satisfy the Bragg condition (Formula 1).

$$\lambda = 2n\Lambda \sin \theta / m \qquad (1);$$

where n is the effective refractive index, Λ is the grating period, and θ is the angle between the facet and the waveguide axis. The waves that do not satisfy the Bragg condition easily leak outside the gain region and, therefore, have a low modal gain with a high threshold current density.

For the waves propagating forward from 0 to L, the angle between the grating and the ray propagation direction is θ. On the other hand, the reflected waves propagating backward from L to 2L is incident on the grating at −θ. The resonance Bragg condition is satisfied both for the forward and backward propagating waves at the same time only for a single lateral mode. The α-DFB grating, therefore, serves as a spatial mode filter.

The α-DFB configuration has not been attempted for high average power QCLs for two main reasons:
1. The α-DFB configuration is an approach to scaling QCL optical power with active region dimensions without sacrificing beam quality. Broad area devices are of primary interest in this case. The active region self-heating for QCLs limits active region width for the traditional QCLs to 10-20 μm. Therefore, it appears that this configuration cannot be directly applied to QCLs to increase average optical power level.

A possible approach to the overheating problem was disclosed in U.S. patent application Ser. No. 15/450,575, filed on Mar. 6, 2017, assigned to the present applications assignee, the contents of which are hereby incorporated by reference. In short, it is argued in that disclosure that QCLs with a significantly reduced active region thickness and increased maximum (roll over) current density can still produce a very high average optical power per active region unit area even in a broad area configuration. This requires designing QCLs with increased active region/injector coupling, increased active region doping density, and a higher relative carrier population for the lowest injector state.

Figure 4:
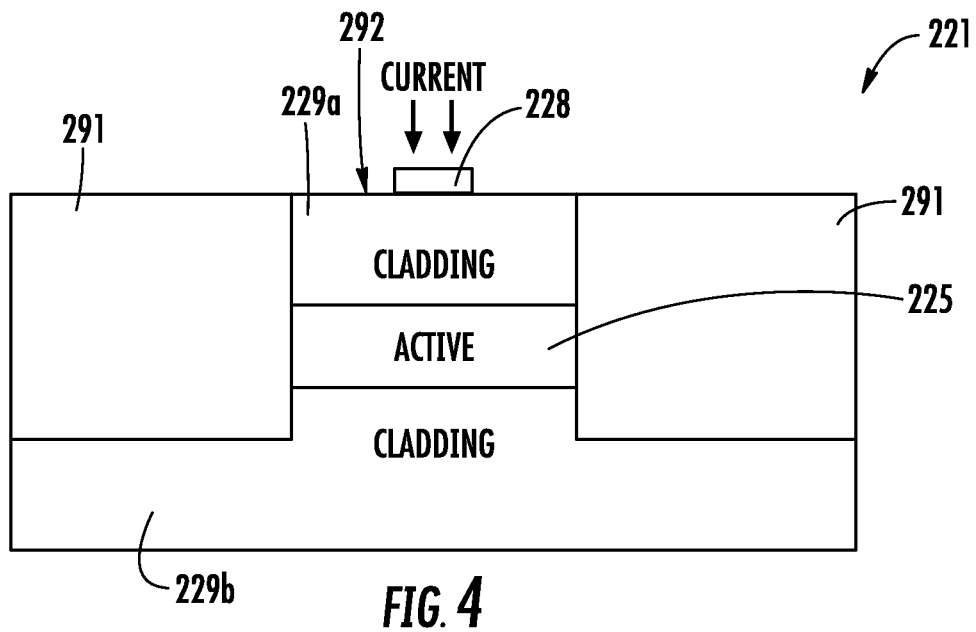
FIG. 4 is a schematic diagram of a deep-ridge QCL configuration, according to the present disclosure.

It is proposed in this disclosure to use the QCLs with a low thermal resistance in the broad area α-DFB configuration. QCLs are traditionally processed into the deep-ridge configuration with the etching profile propagating though the active region (FIG. 4). The deep ridge configuration is used to confine current within the area defined by the ridge and, at the same time, provide a strong lateral waveguide, which increases lateral mode overlap factor with the active region. This configuration, however, is incompatible with the α-DFB grating as the strong lateral waveguide negates the spatial-mode filtering properties of the grating.

Figure 5:
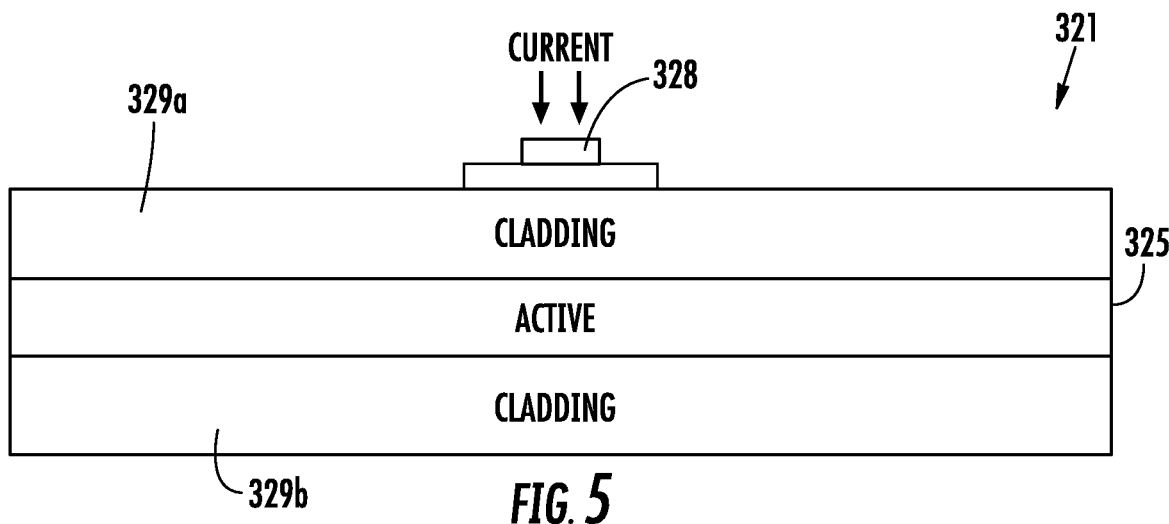
FIG. 5 is a schematic diagram of a shallow-ridge QCL configuration, according to the present disclosure.

It is proposed in this disclosure, instead, to use the shallow ridge configuration, shown in FIG. 5, for α-DFB QCLs. While current spreading in the n-doped cladding/waveguide layers is significant, it was shown in References [4, 5] that it is still limited to 50-100 μm. The QCL with an ultra-thin active region (low thermal resistance) and 50-100 μm-wide electrically pumped active region are projected to efficiently operate even under high duty-cycle conditions. Therefore, they can be effectively used in the α-DFB configuration. Current spreading in this configuration can be controlled by carefully choosing the optimal contact stripe width, by adjusting cladding/waveguide layers doping, and by optimizing ridge depth.

Figure 6:
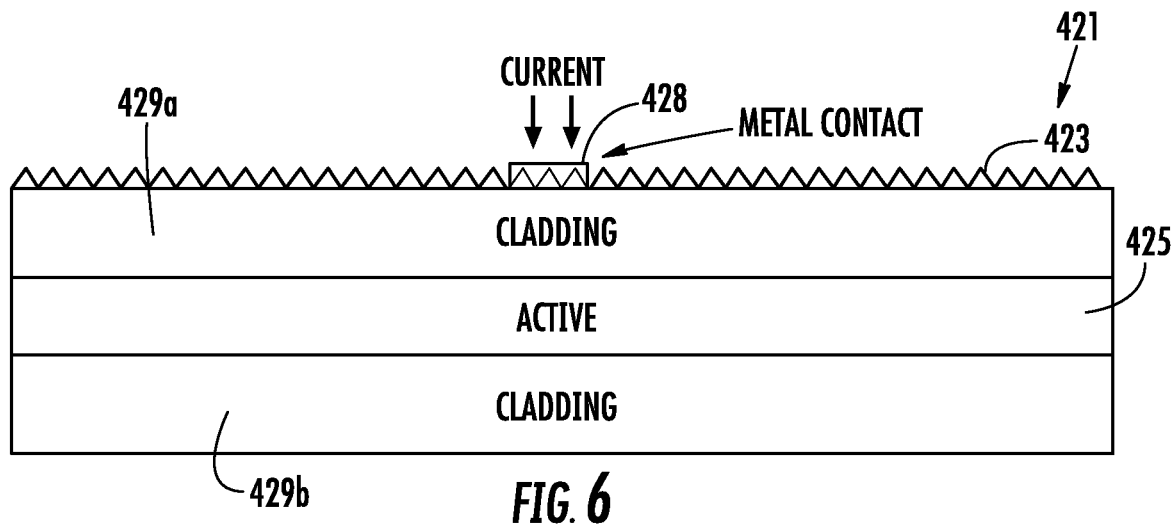
FIG. 6 is a schematic diagram of a contact-strip QCL configuration, according to the present disclosure.

The limiting case for the shallow ridge configuration is a simple contact-stripe configuration shown in FIG. 6. Combination of the simple wafer processing for this configuration and the capability of high average power operation are projected to dramatically reduce price per watt for high power QCLs.

Figure 7:
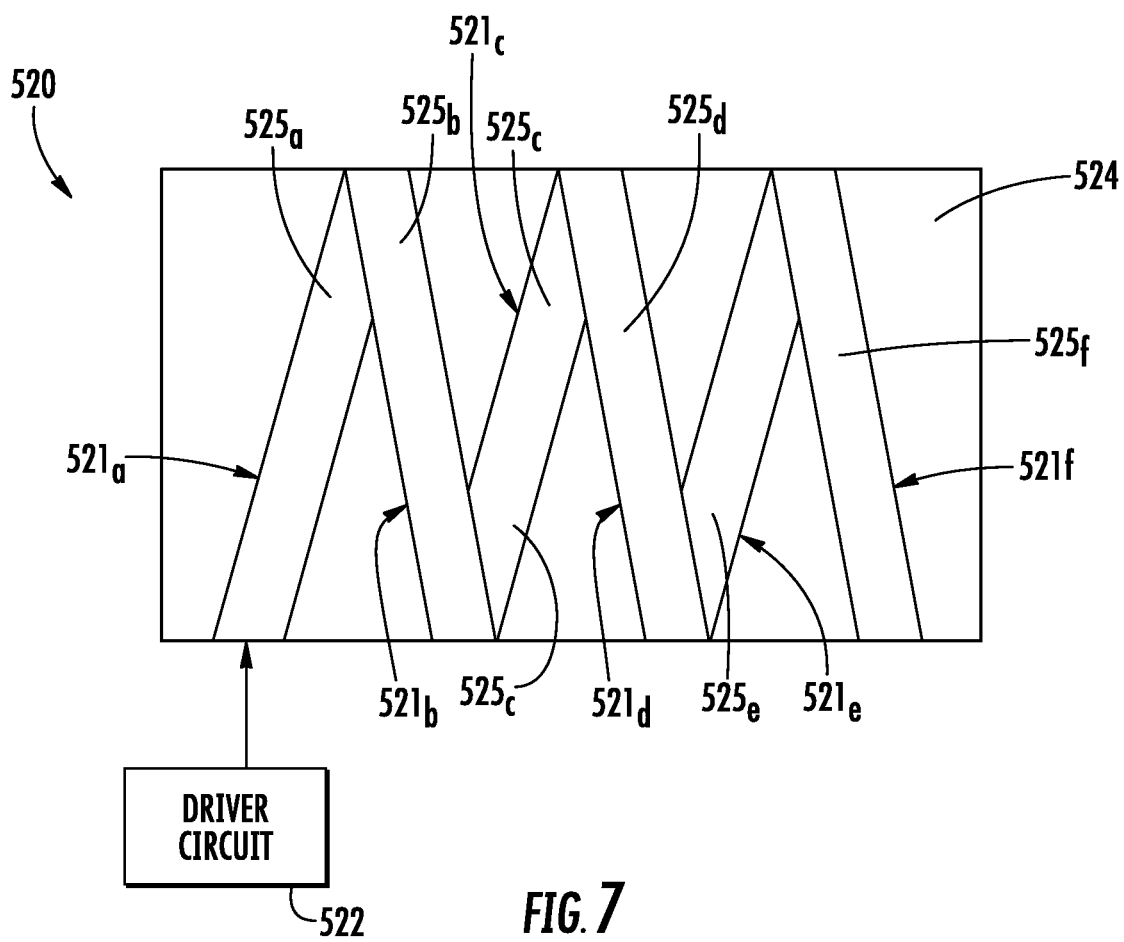
FIG. 7 is a schematic diagram of a coherent array of α-distributed feedback QCLs, according to the present disclosure.

To summarize, the proposed approach herein includes: employment of ultra-thin active region with dramatically reduced thermal resistance; employment of shallow ridge or simple contact-stripe configuration to suppress mode reflection at the lateral active region/waveguide interface; and employment of the α-DFB grating for the spatial mode selection. The very high power QCLs will find immediate applications in a number of applications requiring high power, high brightness infrared laser sources. α-DFB QCLs can be combined into a W-shaped array as shown in FIG. 7 to reach optical power levels in excess of 100 W into a high brightness beam.

Referring now to FIG. 2, another embodiment of the QCL 121 is now described. In this embodiment of the QCL 121, those elements already discussed above with respect to FIG. 1 are incremented by 100. The QCL 121 illustratively includes a substrate 124 and an emitting facet 126, and one or more semiconductor layers adjacent the substrate and defining an active region 125. The active region 125 illustratively includes a longitudinal axis 127 canted at an oblique angle (θ) to the emitting facet 126 of the substrate 124. The QCL 121 illustratively includes an optical grating 123 being adjacent the active region 125 and configured to emit a CW or pulsed laser output through the emitting facet 126.

In the illustrated embodiment, the optical grating 123 defines a plurality of ridges substantially parallel (between 0 and 5 degrees of cant between the ridges and the longitudinal axis) with the longitudinal axis 127 of the active region 125. Also, in the illustrated example, the optical grating 123 comprises a Bragg grating, which permits the active region 125 to be configured to operate in a single spatial mode.

Also, the active region 125 may have a thickness less than or equal to 1.3 μm, and the active region may have a width greater than or equal to 20 μm. The active region 125 may have an elongate shape extending laterally across the substrate 124. Of course, these dimensional ranges are merely exemplary and could be different in other embodiments.

Another aspect is directed to a method for making a QCL 121. The method includes forming a substrate 124 and at least one emitting facet 126, and forming one or more semiconductor layers adjacent the substrate and defining an active region 125. The active region 125 has a longitudinal axis 127 canted at an oblique angle to the at least one emitting facet 126. The method comprises forming an optical grating 123 being adjacent the active region 125 and configured to emit a CW or pulsed laser output through the at least one emitting facet.

Referring now additionally to FIG. 4, another embodiment of the QCL 221 is now described. In this embodiment of the QCL 221, those elements already discussed above with respect to FIG. 2 are incremented by 200 and most require no further discussion herein. This embodiment differs from the previous embodiment in that this QCL 221 illustratively includes first and second cladding layers 229-229b surrounding the active region 225. Also, the QCL 221 is typically processed into the deep-ridge configuration with the etching profile propagating though the active region 225. The QCL 221 illustratively includes an isolator region 291 surrounding a deep ridge 292, and a contact strip 228 over the first cladding layer 229.

Referring now additionally to FIG. 5, another embodiment of the QCL 321 is now described. In this embodiment of the QCL 321, those elements already discussed above with respect to FIG. 4 are incremented by 300 and most require no further discussion herein. This embodiment differs from the previous embodiment in that this QCL 321 illustratively uses a shallow ridge configuration where etching is stopped before reaching the active region for providing an α-DFB QCL. The QCL 321 has an ultra-thin active region (low thermal resistance) and a 50-100 μm-wide electrically pumped active region are projected to efficiently operate even under high duty-cycle conditions. Therefore, it can be effectively used in the α-DFB configuration. Current spreading in this embodiment can be controlled by carefully choosing an electrical contact strip 328 width, by adjusting cladding/waveguide layers doping, and by optimizing ridge depth. In other words, the electrical contact strip 328 may have a width configured to control the active region 325.

Referring now additionally to FIG. 6, another embodiment of the QCL 421 is now described. In this embodiment of the QCL 421, those elements already discussed above with respect to FIG. 5 are incremented by 400 and most require no further discussion herein. This embodiment differs from the previous embodiment in that this QCL 421 illustratively includes an optical grating 423.

Referring now to FIG. 7, another aspect is directed to a QCL system 520. The QCL system 520 illustratively includes a plurality of QCLs 521a-521f. Each of the plurality of QCLs 521a-521f illustratively includes a substrate 524 and at least one emitting facet, and semiconductor layers adjacent the substrate and defining an active region 525a-525f. The active region 525a-525f has a longitudinal axis canted at an oblique angle to the at least one emitting facet. Each of the plurality of QCLs 521a-521f illustratively includes an optical grating being adjacent the active region 525a-525f and configured to emit a CW or pulsed laser output through the at least one emitting facet. The QCL system 520 illustratively includes a driver circuit 522 coupled to the plurality of QCLs 521a-521f. In the illustrated embodiment, the plurality of QCLs 521a-521f defines an array thereof arranged in W-shape.

Each of the plurality of QCLs 521a-521f may comprise one or more features from any of the QCL embodiments disclosed herein. Also, features from any of the individual QCL embodiments could be combined with other embodiments.

REFERENCES (ALL REFERENCES LISTED BELOW ARE HEREBY INCORPORATED BY REFERENCE IN THEIR ENTIRETIES)

References

[1] Y. Bai, N. Bandyopadhayay, S. Tsao, S. Slivken, and M. Razeghi, Applied Physics Letters 98, 181102 (2011)
[2] R. Lang, K. Dzurko, A. Hardy, S. Demars, A. Schoenfelder, and D. Welch, IEEE JQE 34, 2196 (1998)
[3] K. Paschke, A. Bogatov, A. Drakin, R. Guther, A. Stratonnikov, H. Wenzel, G. Erbert, and G. Trankle, J. Sel. Top. Quant. Electr. 9, 825 (2003)
[4] C. Becker and A. Lyakh, J. Appl. Phys. 90, 1688 (2001)
[5] A. Lyakh, P. Zory, D. Wasserman, G. Shu, C. Gmachl, M. D'Souza, D. Botez, D. Bour, Appl. Phys. Lett. 90, 141107 (2007)

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

The invention claimed is:

1. A quantum cascade laser (QCL) system comprising:
an array of QCLs, each QCL comprising
  a substrate,
  at least one emitting facet,
  semiconductor layers adjacent the substrate and defining an active region,
  the active region having a longitudinal axis canted at an oblique angle to the at least one emitting facet, and
  an optical grating being adjacent the active region and configured to emit one of a continuous wave (CW) laser output or a pulsed laser output through the at least one emitting facet;
the active regions of the array of QCLs arranged in a W-shape and canted at an oblique angle to each other, each of the active regions extending between opposing ends of the substrate; and
a driver circuit coupled to the array of QCLs.

2. The QCL system of claim 1 wherein the optical grating defines a plurality of ridges substantially parallel with the longitudinal axis of the active region.

3. The QCL system of claim 1 wherein the optical grating comprises a grating satisfying the Bragg condition.

4. The QCL system of claim 1 wherein the active region is configured to operate in a single mode.

5. The QCL system of claim 1 wherein the optical grating comprises a shallow ridge configuration grating; and further comprising an electrical contact strip coupled to the semiconductor layers; and wherein the electrical contact strip has a width configured to control an effective active region width.

6. The QCL system of claim 1 wherein the active region has a thickness less than or equal to 1.3 μm; and wherein the active region has a width greater than or equal to 20 μm.

7. The QCL system of claim 1 wherein the substrate comprises at least one of InP, GaAs, GaSb, and Si.

8. The QCL system of claim 1 wherein the array of QCLs comprises an array of α-QCLs.

9. The QCL system of claim 1 wherein the optical grating is configured to emit at a power level greater than 100 W.

10. The QCL system of claim 1 wherein the optical grating is configured to emit the pulsed laser output through the at least one emitting facet.

11. A quantum cascade laser (QCL) system comprising:
an array of distributed feedback (DFB) QCLs, each DFB QCL comprising
a substrate,
at least one emitting facet,
semiconductor layers adjacent the substrate and defining an active region,
the active region having a longitudinal axis canted at an oblique angle to the at least one emitting facet, and
an optical grating being adjacent the active region and configured to emit one of a continuous wave (CW) laser output or a pulsed laser output through the at least one emitting facet;
the active regions of the array of DFB QCLs arranged in a W-shape and canted at an oblique angle to each other, each of the active regions extending between opposing ends of the substrate; and
a driver circuit coupled to the array of DFB QCLs.

12. The QCL system of claim 11 wherein the optical grating defines a plurality of ridges substantially parallel with the longitudinal axis of the active region.

13. The QCL system of claim 11 wherein the optical grating comprises a grating satisfying the Bragg condition.

14. The QCL system of claim 11 wherein the active region is configured to operate in a single mode.

15. The QCL system of claim 11 wherein the optical grating comprises a shallow ridge configuration grating; and further comprising an electrical contact strip coupled to the semiconductor layers; and wherein the electrical contact strip has a width configured to control an effective active region width.

16. The QCL system of claim 11 wherein the active region has a thickness less than or equal to 1.3 µm; and wherein the active region has a width greater than or equal to 20 µm.

17. The QCL system of claim 11 wherein the substrate comprises at least one of InP, GaAs, GaSb, and Si.

18. The QCL system of claim 11 wherein the array of DFB QCLs comprises an array of α-QCLs.

19. The QCL system of claim 11 wherein the optical grating is configured to emit at a power level greater than 100 W.

20. The QCL system of claim 11 wherein the optical grating is configured to emit the pulsed laser output through the at least one emitting facet.

* * * * *